United States Patent
Cho

[19]

[11] Patent Number: 5,958,270
[45] Date of Patent: *Sep. 28, 1999

[54] WIRE BONDING WEDGE TOOL WITH ELECTRIC HEATER

[75] Inventor: Jae Weon Cho, Choongchungbook-Do, Rep. of Korea

[73] Assignee: LG Semicon Co., Ltd., Cheongju, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/589,678

[22] Filed: Jan. 22, 1996

[30] Foreign Application Priority Data

Sep. 2, 1995 [KR] Rep. of Korea ........................ 95-28689

[51] Int. Cl.⁶ ........................................................... H05B 1/00
[52] U.S. Cl. ........................... 219/221; 219/243; 219/229; 228/4.5; 228/1.1
[58] Field of Search ..................................... 219/221, 243, 219/229, 85.18, 85.16; 228/51, 904, 4.5, 1.1; 156/433, 502

[56] References Cited

U.S. PATENT DOCUMENTS

| | | | |
|---|---|---|---|
| 1,304,146 | 5/1919 | Bertuleit | 219/243 |
| 1,767,607 | 6/1930 | Moulthrop | 219/243 |
| 2,464,633 | 3/1949 | Bohener | 219/243 |
| 3,101,635 | 8/1963 | Kulicke, Jr. | 219/85.16 |
| 3,271,555 | 9/1966 | Hirson et al. | 219/85.18 |
| 3,627,192 | 12/1971 | Killingsworth | 228/4.5 |
| 3,641,304 | 2/1972 | Angelucci | 219/85.16 |
| 3,766,623 | 10/1973 | Lerner et al. | 219/221 |
| 4,030,657 | 6/1977 | Scheffer | 228/4.5 |
| 4,117,306 | 9/1978 | Shah | 219/243 |
| 4,315,128 | 2/1982 | Matcovich et al. | 219/85.16 |
| 4,451,325 | 5/1984 | Bubenzer | 156/583.1 |
| 4,597,520 | 7/1986 | Biggs | 228/4.5 |
| 4,619,395 | 10/1986 | Amorosi et al. | 228/4.5 |
| 4,821,944 | 4/1989 | Tsumura | 228/230 |
| 5,240,166 | 8/1993 | Fontana, Jr. et al. | 219/85.18 |
| 5,486,682 | 1/1996 | Rysemus | 219/544 |
| 5,650,081 | 7/1997 | Hudson | 219/229 |

FOREIGN PATENT DOCUMENTS

| | | |
|---|---|---|
| 59-159538 | 9/1984 | Japan . |
| 60-88439 | 5/1985 | Japan . |
| 6-204301 | 7/1994 | Japan . |
| 6-260526 | 9/1994 | Japan . |
| 6-268029 | 9/1994 | Japan . |

OTHER PUBLICATIONS

Davies, R.W. et al, "Composite Thermocompression Bonding Thermode", Western Electric Tech. Digest No. 34, Apr. 1974, pp. 9–10.

*Primary Examiner*—Teresa Walberg
*Assistant Examiner*—Vinod D. Patel
*Attorney, Agent, or Firm*—Fleshner & Kim

[57] ABSTRACT

In a wedge tool having a heating device, a metal rod having a heating line, a conductive wire or a thin film-type heating plate is disposed at a predetermined portion of the wedge tool, to which power is supplied through a power supply unit, respectively, in order to provide heat to the wedge tool in wire bonding process. By having such a construction, the wedge tool has the heating system for generating heat, so that a substantially preferable and remarkable bonding force can be obtained.

10 Claims, 4 Drawing Sheets

WIRE BONDING WEDGE TOOL WITH ELECTRIC HEATER

BACKGROUND OF THE INVENTION

1. Field of the Invention

The present invention relates to a semiconductor device, and more particularly to a wedge tool having a heating device capable of accomplishing a satisfactory and excellent bondability.

2. Description of the Prior Art

A conventional ceramic-type semiconductor device, as shown in FIG. 1, includes a semiconductor chip 1, a cavity 2 and a lead base 3 for receiving the semiconductor chip 1, and a metal cap (not shown) for sealing the cavity 2.

Generally, in the ceramic-type semiconductor package, a wire bonding process is performed after die/attaching process for mounting the semiconductor 1 on the lead base 3. At this time, after an aluminium wire 6 is inserted into a wedge tool 4, a pad 1a and an inner lead 5 of the ceramic package 10 are wire-bonded by a ultrasonic waves and a mechanical pressure transmitted to the wedge tool 4 from a wedge equipment (not shown).

However, as for the wedge tool 4, as shown in FIG. 2, because the wire bonding is performed by only the ultrasonic waves and the mechnical pressure without any heating device, there occurs a problem that the bonding force is degraded. That is, since the aluminum wire 6 is bonded only by the mechnical pressure, its reliability is hardly obtained.

SUMMARY OF THE INVENTION

Therefore, an object of the present invention is to provide a wedge tool having a heating device by which heat is applied to a wedge tool.

Another object of the present invention is to provide a wedge tool having a heating device capable of preventing any movement of a wire.

In order to obtain the above object, there is provided a wedge tool including a metal rod being installed at a predetermined portion of a wedge tool and having a heating line; a hole being formed at a protrusion positioned at a predetermined portion of a lower part of the wedge tool so as to allow a wire to be inserted; and a power supply unit for supplying an alternate current power source to the heating line of the metal rod.

DETAILED DESCRIPTION OF THE INVENTION

The preferred embodiments according to the present invention will now be described in detail.

Figure 1:
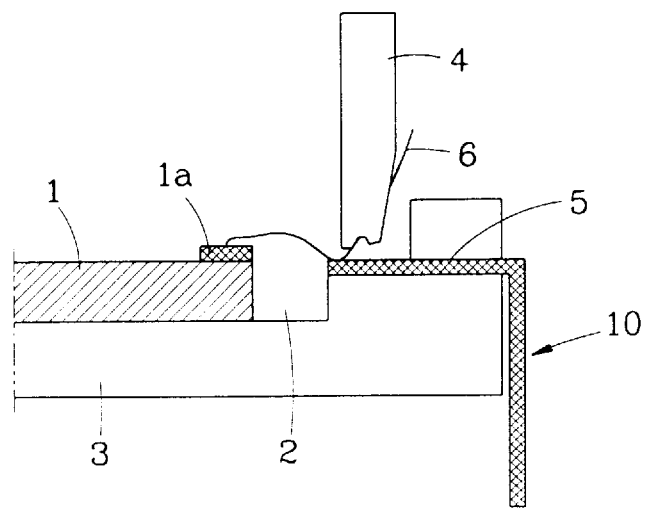
FIG. 1 is a cross-sectional view showing a state of a wire bonding of a conventional ceramic package by means of a wedge tool.
Figure 2:
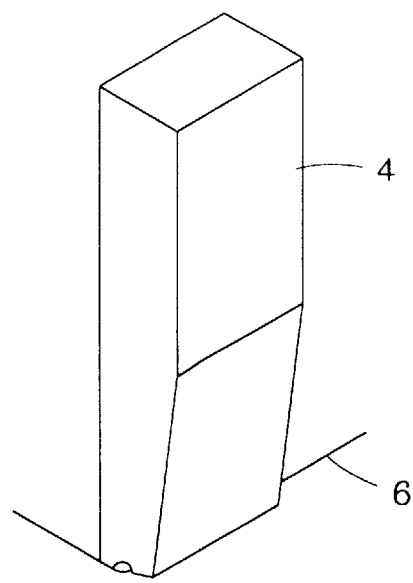
FIG. 2 is a schematic cross-sectional view of a conventional wedge tool.
Figure 3A:
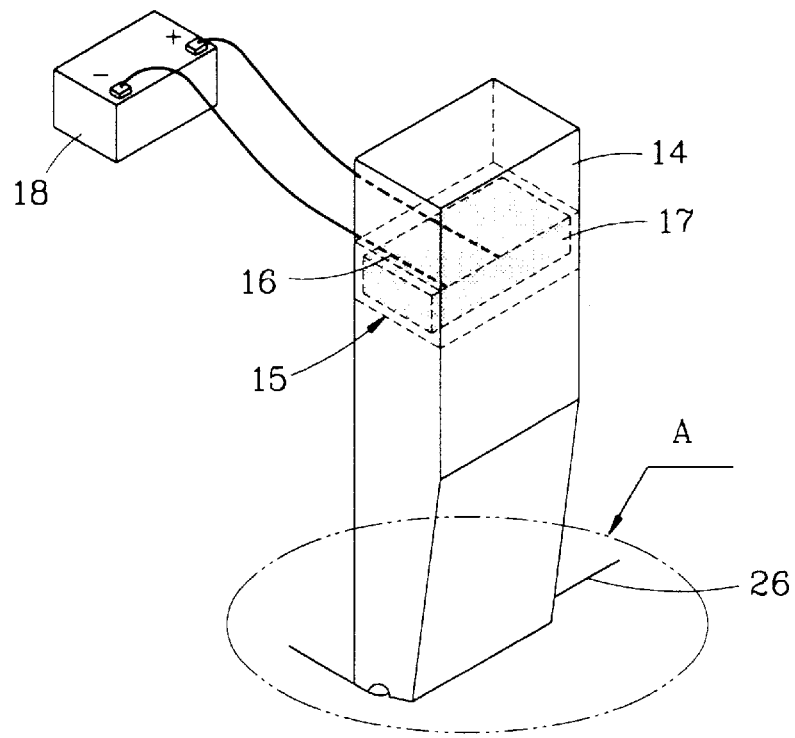
FIG. 3A is a cross-sectional view showing a wedge tool of a first embodiment in accordance with the present invention.
Figure 6A:
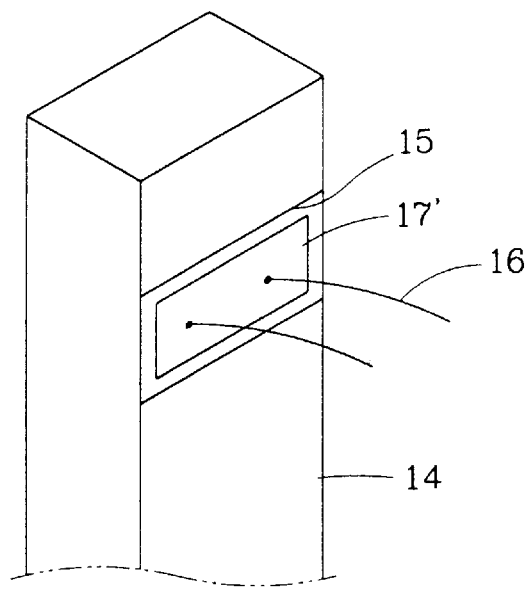
FIGS. 6A and 6B are perspective side views of an exemplary wedge tool of the first embodiment.
Figure 6B:
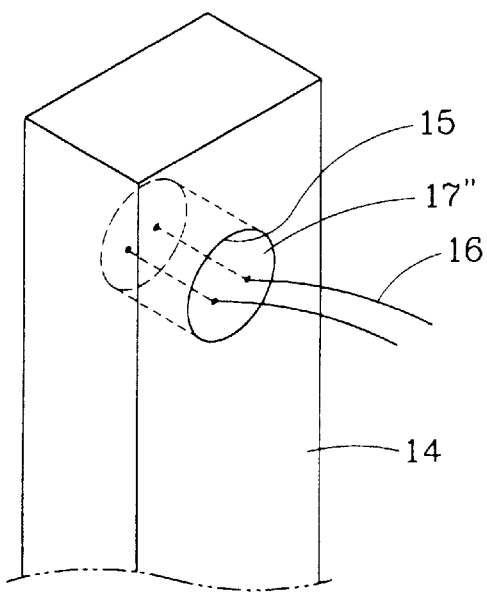

FIG. 3A is a cross-sectional view of one embodiment of the present invention. Reference numeral 14 denotes a wedge tool to be inserted to a wedge equipment (not shown). A metal rod 17 having a heating wire 16 embedded therein is inserted into an insertion hole 15 formed at a predetermined upper portion of the wedge tool 14. FIGS. 6A and 6B show side views of the wedge tool 14 with exemplary rectangular and cylindrical shaped metal rods 17' and 17", respectively. A power supply unit 18 disposed at a predetermined portion of the wedge equipment, not shown in detail, is connected to the heating wire 16 of the metal rod 17 to provide a predetermined alternate current power source thereto, even though it is not shown in detail.

Figure 3B:
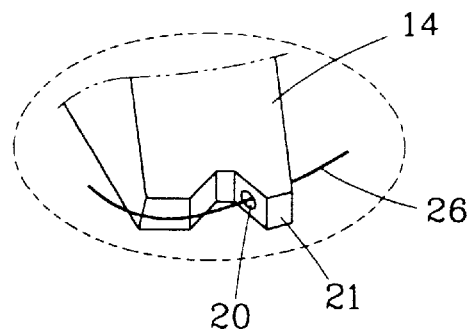
FIG. 3B is enlarged perspective view of portion "A" of FIG. 3A, the low part of the wedge tool of the present invention.

At a lower part of the wedge tool 14, as shown in FIG. 3B, a hole 20 is formed at an inside of the protrusion 21 in order to prevent any movement of a wire 26, through which the wire 26 passes.

Under the condition that the wedge tool 14 is provided with the wire 26 inserted into the hole 20 formed at the lower part thereof, when power is supplied to the power supply unit 18, heat is provided to the heating wire 16 of the metal rod 17 inserted into the predetermined portion of the wedge tool 14. At this moment, the heat is approximately of 200° C.–250° C.

Consequently, as to the wedge tool 14 according to the embodiment of the present invention, in wire bonding, the heat is provided to the lower part "A" of the wedge tool 14, thereby improving a bondability of the wire 26.

Figure 4:
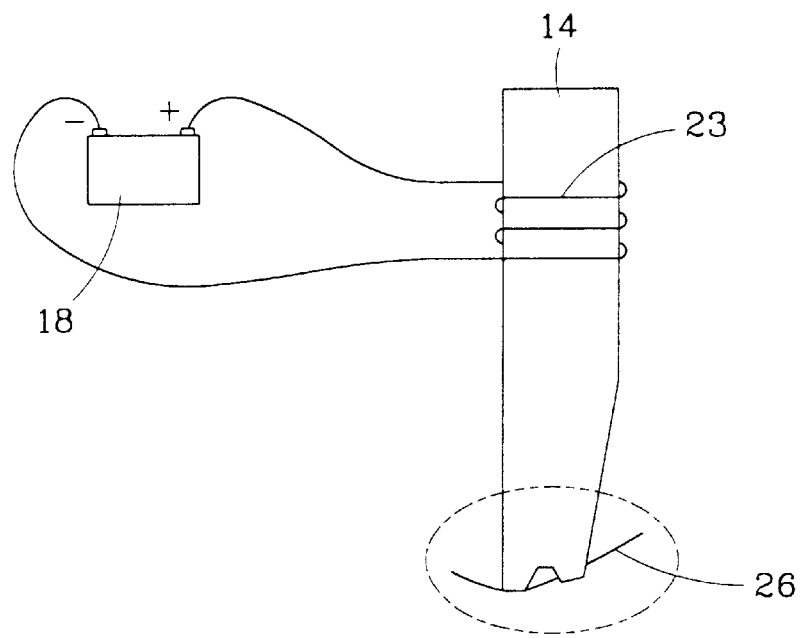
FIG. 4 is a cross-sectional view showing a wedge tool of a second embodiment in accordance with the present invention.

FIG. 4 is a cross-sectional view of another embodiment of the present invention.

In this embodiment, there is provided a heating transmission means wound at a predetermined circumferential portion of a wedge tool 14 instead of the metal rod 17 having the heating wire 16. The heating transmission means employes a conductive wire 23.

The conductive wire 23 is connected to a power supply unit 18 such as in the first embodiment described above. Therefore, also in this embodiment, the heating device is provided at the wedge tool, so that a favorable wire bonding can be performed.

Figure 5:
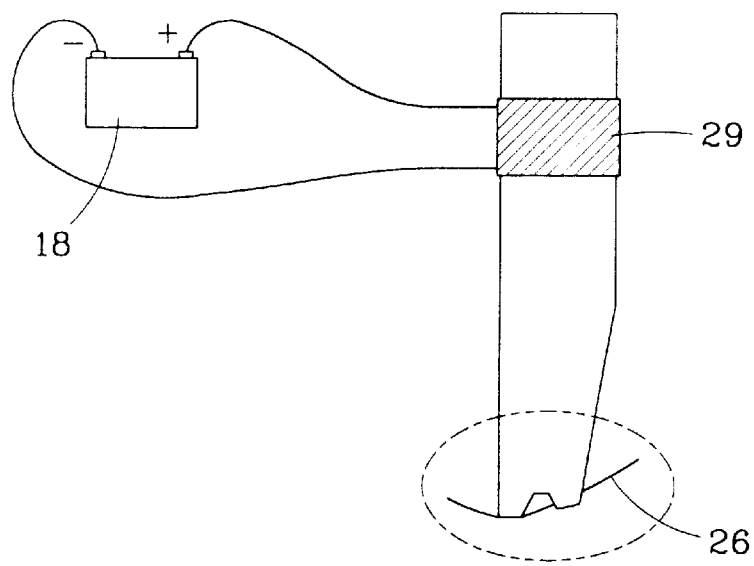
FIG. 5 is a cross-sectional view showing a wedge tool of a third embodiment in accordance with the present invention.

FIG. 5 is a cross-sectional view of still another embodiment according to the present invention, in which a thin film-type heating plate 29 is adapted instead of the conductive wire 23 as in FIG. 3. This thin film-type heating plate 29 is also made from a conductive material, to which a power supply unit 18 is connected in the same way as in the proceeding embodiments described above.

Likewise, in the third embodiment, the heating device is also disposed at the wedge tool, thereby performing a preferable wire bonding.

As so far described, by adapting the wedge tool having the heating device in the present invention, a heating device or a heating system for generating heat is provided to a semiconductor package in which actually heat is hardly transmitted thereto, thereby accomplishing an excellent and more improved wire bonding force.

What is claimed is:

1. A wedge tool comprising:
    an elongated body unit having two opposing ends;
    a first hole formed in a side portion of said elongated body unit of said wedge tool;
    a metal bar formed in the first hole;
    heating wires embedded in the metal bar formed in the first hole;
    a power supply unit coupled to the heating wires for supplying electric power;
    first and second protrusions at one of said ends; and
    a second hole formed through an edge portion of the first protrusion of the wedge tool and a bonding area formed on the second protrusion, wherein when enabled the metal bar provides heat to the bonding area, wherein when enabled the wedge tool further provides mechanical force, ultrasonic waves and said heat to the bonding area for bonding of the bonding material, and wherein said heat at the bonding area is approximately 200° C. to 250° C.

2. The wedge tool of claim 1, wherein the metal bar is rectangular in shape.

3. The wedge tool of claim 1, wherein the metal bar is cylindrical in shape.

4. The wedge tool of claim 1, wherein the wedge tool receives a bonding material through the second hole.

5. The wedge tool of claim 4, wherein the second hole limits movement of the bonding material.

6. The wedge tool of claim 1, wherein the bonding material is a conductive wire.

7. A bonding system comprising:
    a semiconductor package having an inner lead;
    a semiconductor chip having a pad;
    a bonding material; and
    a wedge tool, wherein the wedge tool comprises,
        an elongated body unit having two opposing ends,
        a first hole formed in a side portion of said elongated body unit of said wedge tool,
        a metal bar formed in the first hole,
        heating wires embedded in the metal bar formed in the first hole,
        a power supply unit coupled to the heating wires for supplying power,
        first and second protrusions at one of said ends, and
        a second hole formed through an edge portion of the first protrusion of the wedge tool and a bonding area formed on the second protrusion, wherein the bonding material passes through the second hole and over the bonding area, wherein when enabled the wedge tool provides heat to the bonding area, wherein said heat at the bonding area is substantially transferred to the bonding material and not substantially transferred to the pad and the inner lead, wherein said heat at the bonding area is approximately 200° C. to 250° C., wherein the bonding material is a conductive wire, and wherein the second hole limits movement of the conductive.

8. The bonding system of claim 7, wherein when enabled the wedge tool further provides mechanical force, ultrasonic waves and said heat to the bonding area to improve bonding of the bonding material.

9. The bonding system of claim 8, wherein the wedge tool uses the bonding area to bond the bonding material to at least one of the pad and the inner lead.

10. The bonding system of claim 8, wherein the metal bar is at least one of cylindrical in shape and rectangular in shape.

* * * * *